(12) United States Patent
Gabriele et al.

(10) Patent No.: US 6,875,318 B1
(45) Date of Patent: Apr. 5, 2005

(54) METHOD FOR LEVELING AND COATING A SUBSTRATE AND AN ARTICLE FORMED THEREBY

(75) Inventors: Alfred M. Gabriele, Lincoln, RI (US); Peter Dragone, Concord, MA (US); Jacob Avissar, Providence, RI (US); Timothy Coxon, White Hall, MD (US)

(73) Assignee: Metalbond Technologies, LLC, White Hall, MD (US)

( * ) Notice: Subject to any disclaimer, the term of this patent is extended or adjusted under 35 U.S.C. 154(b) by 0 days.

(21) Appl. No.: 09/833,036

(22) Filed: Apr. 11, 2001

Related U.S. Application Data
(60) Provisional application No. 60/196,561, filed on Apr. 11, 2000.

(51) Int. Cl.$^7$ .............................. C23C 14/34; B05D 3/02
(52) U.S. Cl. ..................... 204/192.1; 204/486; 204/488; 427/545; 427/250; 427/372.2; 427/384; 427/386; 427/404
(58) Field of Search ................................ 427/545, 250, 427/372.2, 384, 386, 404; 204/192.1, 486, 488

(56) References Cited

U.S. PATENT DOCUMENTS

| | | | |
|---|---|---|---|
| 4,170,686 A | 10/1979 | Miller et al. ................. 428/416 |
| 4,382,977 A | 5/1983 | Murphy et al. ............... 427/42 |
| 4,424,254 A | 1/1984 | Hedrick et al. .............. 428/215 |
| 4,550,060 A | 10/1985 | Makhlouf et al. ......... 428/423.1 |
| 4,716,050 A | 12/1987 | Green et al. .................. 427/99 |
| 4,720,401 A | 1/1988 | Ho et al. ..................... 427/250 |
| 4,751,103 A | 6/1988 | Goel .......................... 427/54.1 |
| 4,777,090 A | 10/1988 | Ovshinsky et al. .......... 428/408 |
| 4,795,660 A | 1/1989 | Cooray et al. ............... 427/123 |
| 4,803,094 A | 2/1989 | Myers .......................... 427/40 |
| 4,828,870 A | 5/1989 | Ando et al. .................. 427/38 |
| 4,844,851 A | 7/1989 | Hotta et al. ................. 264/129 |
| 4,950,365 A | 8/1990 | Evans ........................ 204/38.7 |
| 4,973,388 A | 11/1990 | Francois et al. ........... 204/38.4 |
| 4,983,454 A | 1/1991 | Hiraki et al. ................ 428/335 |
| 5,001,173 A | 3/1991 | Anderson et al. ........... 523/406 |
| 5,004,672 A | * | 4/1991 | D'Ottavio et al. ........... 430/314 |
| 5,011,733 A | 4/1991 | Hiraki et al. ................ 428/336 |
| 5,032,421 A | 7/1991 | Sarma et al. .................. 427/38 |
| 5,062,939 A | 11/1991 | Roland et al. ............ 204/192.17 |
| 5,104,507 A | * | 4/1992 | Offenburger ............. 204/180.6 |
| 5,244,738 A | 9/1993 | Seibel ......................... 428/418 |
| 5,252,399 A | 10/1993 | Hirata et al. ................. 428/416 |
| 5,272,014 A | 12/1993 | Leyendecker et al. ....... 428/457 |
| 5,275,882 A | 1/1994 | Conley ........................ 428/336 |
| 5,306,407 A | 4/1994 | Hauzer et al. .......... 204/192.38 |
| 5,308,709 A | 5/1994 | Ogino et al. ................. 428/623 |
| 5,356,522 A | 10/1994 | Lal et al. .................. 204/192.15 |
| 5,358,615 A | 10/1994 | Grant et al. ............. 204/192.15 |
| 5,372,685 A | 12/1994 | Anschel ................... 204/192.14 |
| 5,403,458 A | 4/1995 | Hartig et al. ............ 204/192.15 |
| 5,403,629 A | 4/1995 | Eichmann et al. ........... 427/576 |
| 5,405,920 A | 4/1995 | Barbee et al. ............... 525/440 |
| 5,407,548 A | 4/1995 | Kopacz et al. ......... 204/192.15 |
| 5,536,583 A | 7/1996 | Roberts et al. .............. 428/457 |
| 5,597,458 A | 1/1997 | Sanchez, Jr. et al. ..... 204/192.3 |
| 5,614,248 A | 3/1997 | Schiller et al. ................. 427/8 |
| 5,616,362 A | 4/1997 | Goldschmied et al. ....... 427/328 |
| 5,658,649 A | 8/1997 | Wrobleski et al. ........... 428/213 |
| 5,691,048 A | 11/1997 | Roberto et al. .............. 428/334 |
| 5,738,917 A | 4/1998 | Besser et al. ................ 427/576 |
| 5,756,218 A | 5/1998 | Buchheit et al. ............. 428/469 |
| 5,807,959 A | 9/1998 | Wu et al. ..................... 528/101 |
| 5,858,471 A | 1/1999 | Ray et al. .................... 427/524 |
| 5,869,198 A | 2/1999 | Erne et al. ................... 428/626 |
| 5,922,448 A | 7/1999 | Das et al. .................. 428/297.4 |
| 5,942,089 A | 8/1999 | Sproul et al. ........... 204/192.13 |
| 5,968,662 A | 10/1999 | Morishige et al. ........... 428/458 |
| 5,981,079 A | * | 11/1999 | Mount, III et al. ......... 428/461 |
| 6,007,349 A | * | 12/1999 | Distefano et al. .............. 439/71 |
| 6,334,942 B1 | * | 1/2002 | Haba et al. .................. 205/122 |

FOREIGN PATENT DOCUMENTS

EP     1 116 801 A1     7/2001     ........... C23C/14/48

OTHER PUBLICATIONS

LeMaster, Edward A; Compact Disc Manufacturing Procesures and Processes, University of Washington, ENGR 498H, Mar. 5, 1994, 9 pgs.
Lithography, Pattern Transfer, http://www.memsnet.org/mems/beginner/lithography.html, 13 pgs.
The Mastering Process: What you Need to Know, http:/www.optical-disc.com/needtoknow.html, 5 pgs.
Barnes, Scott, Image Reversal of Positive Photoresists, Lab Report for Physics 134, Advanced Physics Lab, University of CA, Santa Cruz, Dept. of Physics, Winter Quarter 1987.

* cited by examiner

*Primary Examiner*—Steven Versteege
(74) *Attorney, Agent, or Firm*—Salter & Michaelson

(57) ABSTRACT

A method for providing a level surface onto which a metallic coating may be applied is provided. Articles formed using the method are also provided. The method involves leveling the surface of a substrate by applying an electrophoresis polymeric coating followed by a physical vapor deposition of a metallic coating.

21 Claims, 4 Drawing Sheets

METHOD FOR LEVELING AND COATING A SUBSTRATE AND AN ARTICLE FORMED THEREBY

RELATED CASES

Priority for this application is hereby claimed under 35 U.S.C. § 119(e) to commonly owned and now abandoned U.S. Provisional Patent Application No. 60/196,561 which was filed on Apr. 11, 2000 in the name of Alfred M. Gabriele et al. and which is incorporated by reference herein in its entirety.

BACKGROUND

1. Technical Field

The present application is directed to a method for leveling a substrate and an article formed thereby and, in particular, to a method for providing a level surface onto which a coating may be applied.

2. Related Art

Physical Vapor Deposition (PVD) processes are capable of providing relatively thin (typically in the micron range) metallic coatings that have high luster and superior wear characteristics. These characteristics are desirable in many applications and, in particular, for decorative coatings. However, the characteristics may be affected by the quality of the substrate. Generally, because PVD coatings are thin, they cannot eliminate surface defects such as pores or surface roughness, and in many instances surface defects are highlighted. For example, a PVD coating applied to a rough or brushed substrate will be dull, because the PVD coating conforms to the surface on which it is applied. In addition to affecting the aesthetic characteristics of PVD coatings, porous or rough substrates may have substances trapped in pores or depressions. When such substances outgas before or during the PVD process, it may be detrimental to the PVD equipment or coating, even when present in minimal amounts. For example, outgassing substances may prevent the PVD equipment from achieving the proper vacuum level, or may evaporate and be co-deposited with the PVD coating material.

For the foregoing reasons, PVD coatings have generally been limited to substrates having smooth or non-porous surfaces, or surfaces that can be made smooth or non-porous. Thus, PVD coatings have not been used in many otherwise suitable applications. For example, certain porous substrates such zinc, brass, steel, aluminum and tin are desirable in many applications because they are relatively inexpensive. Methods have therefore been devised to "level" the surface of rough or porous substrates. Such "leveling" methods in some instances seal the substrate surface, providing improved corrosion resistance and promoting the adhesion of coatings to the substrate surface.

One method that has been used to level porous or rough surfaces is by polishing. PVD coated polished surfaces generally will be shiny, whereas an unpolished or brushed part will provide a dull coating. Surfaces may be polished using mechanical abrasion, chemical etching, or a combination of both.

Another method that has been used to level porous or rough substrates is to plate the surface, generally with copper, nickel, and chrome, which also improves corrosion resistance and provides a surface to which coatings adhere well. During the plating operation, surface defects are filled in by the plated material, thus leveling the surface. However, many plating operations, in particular chrome plating, are expensive and may be harmful to the environment. In some cases, plating results in an undesirable galvanic coupling.

In addition, substrate preparation processes are time consuming, expensive, and labor intensive. Generally, only premium applications can justify either the high cost of base materials such as stainless steel, or the costs of pre-finishing less expensive substrates before metallizing.

Thus, there is need in the art for alternative methods for substrate preparation and coating substrates.

SUMMARY

The present invention is directed to a method of coating a substrate. The method involves providing a substrate having a surface, forming a polymeric coated surface by applying a layer of a polymeric precursor to at least a portion of the surface, polymerizing the polymeric precursor to form a polymerized layer, and applying a metal coating to at least a portion of the polymeric coated surface. The metal coating is applied under sub-atmospheric conditions. In some embodiments, the step of polymerizing the polymeric precursor includes elevating the temperature of the polymeric precursor to at least about 320° F. In some embodiments, the polymeric precursor is maintained at the elevated temperature for at least about 12 minutes. In some embodiments, the polymeric-precursor is applied electrophoretically. In some embodiments, the polymeric precursor may be selected from the group consisting of acrylics, epoxies, urethanes, and combinations thereof.

Another embodiment of the method involves providing a substrate, coating at least a portion of the substrate with an electrophoretically applied polymeric precursor, polymerizing the polymeric precursor to form a first polymeric coating, and elevating the temperature of the polymeric coating to at least about 400° F. for at least about 6 minutes.

Another embodiment of the method involves forming a polymeric coating from an electrophoretically applied polymeric precursor and applying a layer of metal over the polymeric coating. A layer of metal is then applied in a physical vapor deposition system.

Another embodiment of the invention is directed to an article having a surface. The article includes an electrophoretically applied first polymeric layer overlaying the surface. A metallic coating overlays the first polymeric coating. The thickness of the polymeric layers may range from about 1 millimeter to about 40 millimeters. The thickness of the metal layer may range from about 0.1 millimeter to about 3 millimeters.

BRIEF DESCRIPTION OF THE DRAWINGS

It should be understood that the drawings are provided for the purpose of illustration only and are not intended to define the limits of the invention. The foregoing and other objects and advantages of the embodiments described herein will become apparent with reference to the following detailed description when taken in conjunction with the accompanying drawings in which.

DETAILED DESCRIPTION OF THE PREFERRED EMBODIMENTS

Figure 1:
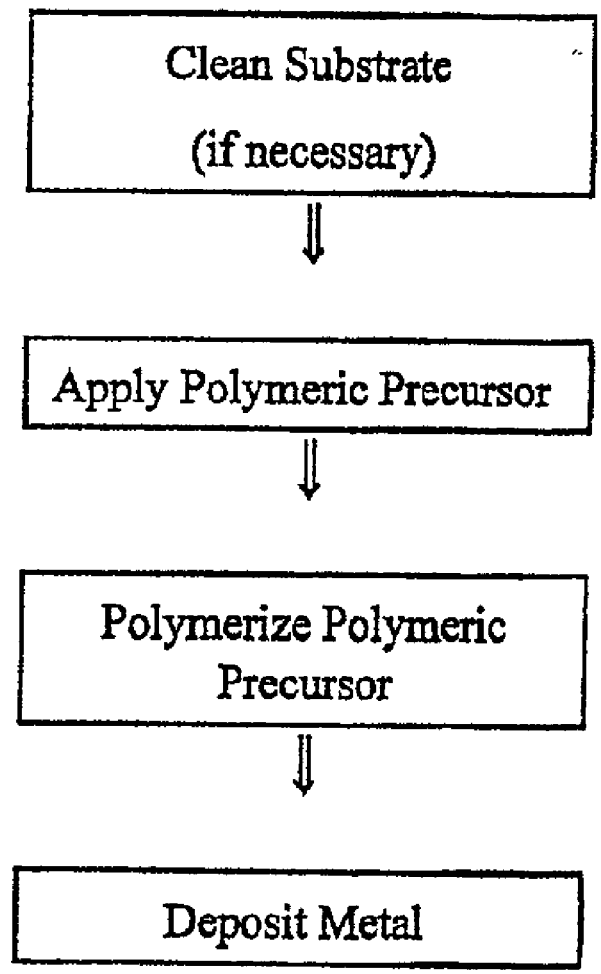
FIG. 1 is a flow chart of a coating process according to one embodiment of the method.

The present disclosure is directed to a method of leveling the surface of a substrate. The method involves applying a polymeric precursor to the surface of the substrate and heating the polymeric precursor at a predetermined temperature and for a predetermined period of time. In another embodiment, the disclosure is directed to a method of applying a metallic coating to a substrate that involves leveling the surface of the substrate before applying the metal. The method involves leveling the surface of the substrate by applying a polymeric precursor to a surface of the substrate and heating the polymeric precursor at a predetermined temperature and for a predetermined period of time, followed by applying a metallic coating to the polymeric coated substrate.

The method of leveling the surface of the substrate will now be described. In some instances, the substrate may require some type of surface preparation, many of which are known in the art. For example, when using a metal substrate, it may be necessary to "debur," or remove high spots from the substrate. This may be accomplished using conventional metal finishing equipment. Alternatively, or in addition to deburring, the substrate may require etching, degreasing, cleaning, and the like. Those of skill in the art will understand the type of surface preparation that may be needed is based on the type of substrate selected and the condition of the substrate surface.

After completion of surface preparation (when needed), a polymeric precursor may then be applied to the surface of the substrate. There are many ways that the polymeric precursor can be applied, many of which are known to those of skill in the art. Any method of applying the polymeric material may be used in the present method, provided that a uniform and relatively thin layer may be provided.

In preferred embodiments, the polymeric material may be applied using an electrophoresis process. Electrophoresis is a preferred process due to the uniformity of coating thickness provided, the speed of deposition of the coating, and the relatively low environmental impact from the process. A typical electrophoresis process involves providing a bath/cell containing a solution/suspension of a polymeric material, immersing a substrate to be coated in the bath, and providing a DC charge to the electrophoresis cell containing the substrate, preferably ranging from about 25 to about 300 volts. The substrate may be allowed to remain in the cell from about 5 to about 300 seconds. The substrate, when immersed in the electrophoretic cell under electrical charge may be anodic or cathodic. The thickness of the polymeric coating may range from about 1 $\mu$m to about 40 $\mu$m, depending upon the DC charge, the length of time in which the substrate remains in the cell, and the type of polymer, among other things.

After applying the polymeric precursor, the coated substrate may be polymerized. Polymerization may be accomplished according to the manufacturer's guidelines, followed by a separate heating step to remove any liquids in which the polymeric precursor was dissolved, suspended, or mixed. However, a single heating step to polymerize the polymeric precursor and remove the solvents is preferred for ease of manufacturing. Removal of substantially all of the liquids from the polymeric coating reduces or eliminates the possibility of any outgassing from the surface of the polymeric coating. Heating may be accomplished using a variety of methods, including convection, infrared, ultraviolet, electron-beam, and others known to those of skill in the art. The present embodiment involves elevating the temperature of the substrate coated with the polymeric precursor to a temperature of about 135° C. to about 215° C. in a convection oven, which is known in the art. The polymeric precursor must be maintained at that temperature for about 30 seconds to about 120 minutes in order to polymerize the polymeric precursor and remove substantially all of the liquids in which the polymeric precursor was dissolved, suspended, or mixed. Those of skill in the art will recognize that the heating time and temperature may vary depending upon, among other things, the type and thickness of the polymeric coating as well as whether the polymeric precursor was polymerized.

Suitable substrates that may be used in conjunction with any of the methods described herein include conductive substrates, non-conductive substrates, porous substrates, non-porous substrates, and combinations thereof. The only limitation on the type of substrate that may be used in conjunction with the methods is that it must be able to withstand the heating temperatures of the method.

Suitable polymeric materials that may be used in conjunction with any of the methods described herein include polyurethanes, acrylics, epoxies, and combinations thereof. One polymeric material that may be used is a polyurethane available under the product name of TECHNICLAD V-BASE® (trademark of Hawking Corporation Ltd/Techniclad Ltd.). The polymeric material provides leveling properties along with the ability to control thickness and reflectivity, which renders mechanical buffing and/or abrading unnecessary. The reflectivity of the polymeric film may be accurately controlled to be matte, gloss, or any degree in between. The corrosion resistance and chemical resistance of substrates may be significantly improved with the application of a layer of polymeric material.

Thus, one aspect of the present invention is the provision of a substrate having a substantially level surface that does not outgas under the influence of a vacuum. Such a substrate facilitates the application of a metal coating using for example, PVD, Chemical Vapor Deposition (CVD), evaporation, or other metal deposition methods. Another aspect of the invention is a method of applying a metal coating to a substrate. Preferably, the surface of the substrate does not outgas. In preferred embodiments, the substrate is level or has been made level. However, the method of applying the metal may be used on rough substrates provided they do not outgas. According to the method, a suitable substrate is first selected. If necessary or desired, surface preparation may be performed. After completion of surface preparation, a polymeric precursor may then be applied to a surface of the substrate. Each of the foregoing steps are performed as previously described.

Before applying the metal coating, the substrate must be free of residues, fingerprints, oils, and any other contaminants which will affect the metal adhesion and uniformity, as is well known to those of skill in the art. Therefore, in some instances, it may be desirable or necessary to clean the substrate before applying the metal coating. Solvent cleaning is not recommended, as the polymeric coating may be damaged or residual solvent may outgas during the metal deposition. Therefore, one preferred cleaning method involves immersing the polymeric coated substrate in an ultrasonic aqueous solution.

After cleaning the polymeric coated substrates, the polymeric coated substrates are positioned on a rack and placed in a metal deposition system. Application of the metal over the polymeric coated substrate is described herein with regard to magnetron sputtering equipment. Those of skill in the art will understand that the metal may be applied by arc deposition, ion beam, e-beam evaporation, and other methods known to those of skill in the art. There are many types of PVD systems available which function and are operated similarly, as known to those of skill in the art A general process is disclosed herein, which may be modified as needed by those of skill in the art. In the present method, the PVD system is a Leybold 2-700 P4 Magnetron Sputtering System. After placing the substrate on the rack, the rack is positioned in the vacuum chamber of the PVD system, which is pumped down to a pressure ranging from about $5\times10^{-4}$ to about $2\times10^{-5}$ millitorr. If desired, the polymeric coated substrates may be sputter etched to remove a thin layer of material from the surface of the substrate. Sputter etching, or glow discharge, is well known in the art, and is typically used to remove from about 10 to about 100 Å of surface material. Thus, a surface free of any oxidation or contamination may be obtained before depositing the metal. As those skilled in the art will understand, sputter etching removes the microlayer of the substrate surface, exposing a fresh surface layer that will bond better with the sputtered or vaporized target materials. Sputter etching is typically performed in an inert gas environment, typically argon gas, through bombardment of the substrate surface with charged ions of gas or target material. In a preferred embodiment, the etching is performed at a voltage range of about 100 to 600 volts. It should be noted that such etching is not necessary to the method, as bonding of the metal to the polymeric surface is possible without etching.

After sputter etching is performed, the polymeric coated substrates may be heated using radiant heat lamps positioned within the vacuum chamber. Substrate heating is generally used to enhance the adhesion of a metal coating to a surface of the underlying substrate. In the present method, the heating temperatures are preferably minimized in order to prevent damage to the underlying polymeric coating. Accordingly, in the present method, the substrates are heated to temperatures ranging from about 45° C. to about 80° C. for a period of about 5 minutes while in the PVD vacuum chamber.

After heating the substrates, if performed, a metal coating is applied to the polymeric coated surface. Surprisingly and unexpectedly, the metal coating adheres so well to the polymeric coating on the substrate that it is possible to begin metal deposition at higher pressure levels than are generally considered suitable, for example, as high as $5\times10^{-4}$ millitorr. A metal coating may be deposited in the thickness range of from about 0.1 microns to about 1.5 microns. Coatings of greater than about 5 microns are possible. For decorative and functional coatings, a thickness of about 1.5 microns is preferred.

In some embodiments, the color of the deposited metal may be changed by introducing a reactive gas into the process chamber of the PVD system during the deposition of the metal. For example, nitrogen introduced into the sputtering chamber during deposition of the metal changes the color of the deposited metal film to yellow. In such instances, RF sputtering must be used, or the substrates must be re-racked in order to achieve a proper contact with the conductive surface of the substrate. Upon completion of the metal deposition, the substrates are cooled and removed from the vacuum chamber. Once the substrates are cooled, they are ready for use.

Suitable metallic materials for deposition onto the polymeric coating include, but are not limited to, titanium, zirconium, chromium gold, silver, platinum, copper, aluminum, tin, molybdenum, boron, graphite, tantalum, tungsten, hafnium, and combinations thereof. Alloys may also be deposited, including titanium-zirconium, titanium-aluminum-vanadium, nickel-chrome, copper-silver, and aluminum-titanium. Alloys are generally used when specific film characteristics are desired, such as a specific sheet resistivity. Preferred coatings include titanium, zirconium, chromium, titanium-aluminum, and aluminum titanium, due to their superior wear characteristics.

In some embodiments, an additional polymeric coating may be applied over the metal coating to further enhance corrosion resistance, add color to the substrate, or function as an additional electrical insulator. In such instances, the method of application and polymerization of the polymeric precursor is performed in accordance with the manufacturer's instructions, which may involve omitting the heating step.

Advantages of the present process include improved corrosion resistance and chemical resistance of the substrate. These improvements will vary with the substrate. The present method of coating substrates allows use of the less expensive substrates that are prone to outgassing as the process effectively levels the surface, thus preventing outgassing under a vacuum, which is used in most metal deposition systems. Therefore, expensive and environmentally hazardous plating processes may be eliminated. In some instances, the requirement for polishing substrates is also eliminated, as the polymerized coating material provides a level, glossy finished surface, which subsequently provides a luster to the PVD coating. Metal coatings adhere well and form strong bonds with the polymeric coatings. Therefore, the metal will not peel from the polymeric coating. In addition to the improved adhesion, the present coating method allows non-traditional and generally less expensive substrates to be used, resulting in reduced costs.

Substrates coated with a polymeric coating according to the present method have a warmer feel rather than a cold, metallic feel. The entire surface is softer in comparison to the surface of metal parts that have been directly PVD coated without an underlying polymeric layer. The polymeric layer functions as a dielectric. Thus, when subsequently PVD coated with a conductive metal, it produces a layering with multiple applications. Thus, the present method followed by PVD provides a combination of dielectric conductive layering without resorting to slower, less cost efficient RF sputtering processes by which other dielectrics may be applied. Such layering has potential in medical, electronic, and other environments in which the polymeric coating alone may not be suitable to the environment in which it is placed, or where solvents would damage a polymeric coating without a metallic coating.

The combination of the polymer/metal provides many improvements over non-layered alternatives. In comparison to surfaces coated solely with a polymeric material and without a metal layer, the method offers superior solvent resistance, superior UV resistance, increased wear characteristics, and an electrically conductive outer layer. In comparison to metal coated surfaces without an underlying polymeric layer, the combination offers superior corrosion resistance, dielectric inner layer, improved coverage of stains and defects, and a level surface.

Figure 2:
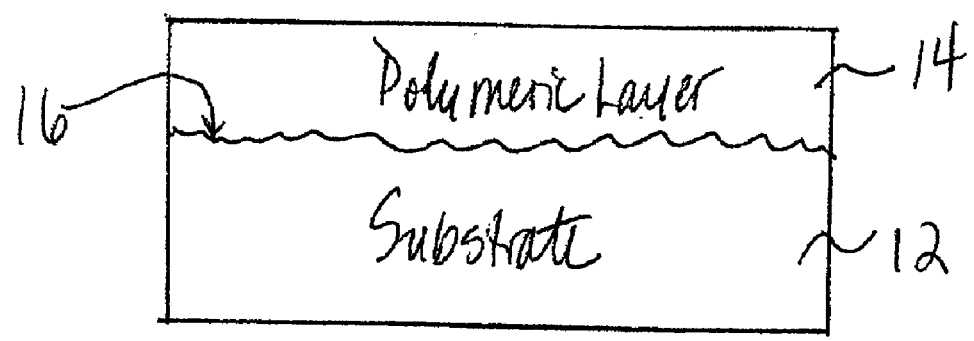
FIG. 2 is a schematic of a substrate leveled using an electrophoresis coating.
Figure 3:
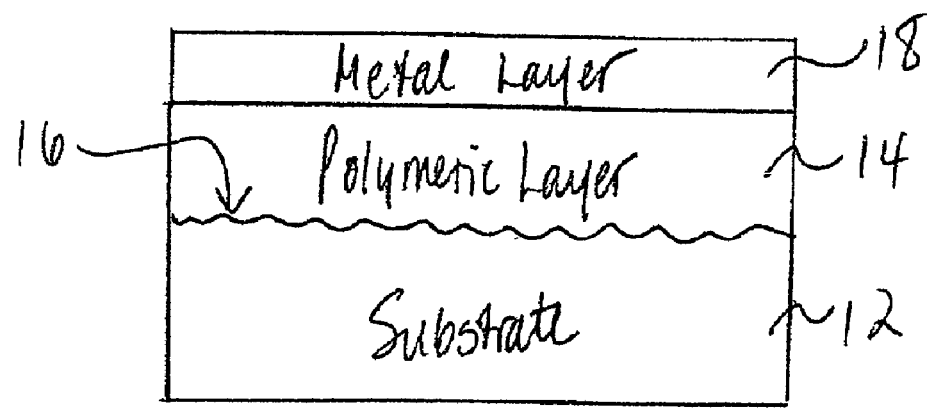
FIG. 3 is a schematic of a leveled substrate coated with metal.
Figure 4:
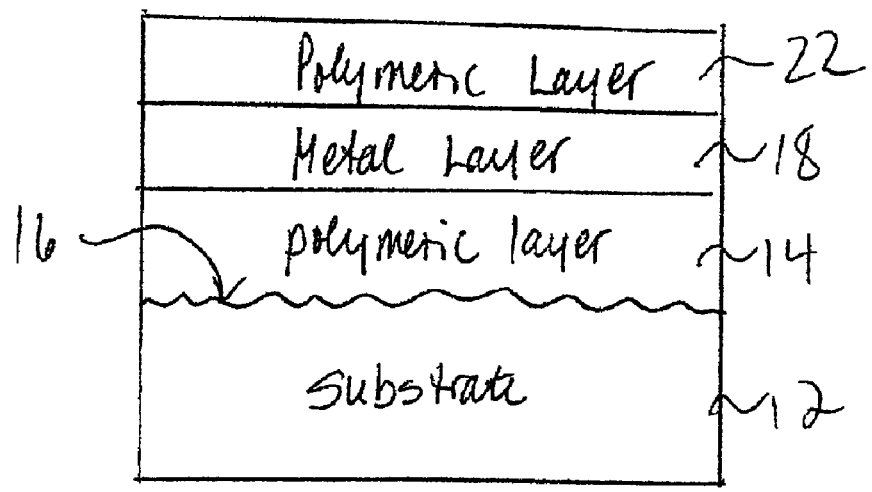
FIG. 4 is a cross-section of a leveled substrate coated with metal and a second electrophoretically applied layer.

The methods are useful for forming articles such as articles as plumbing fixtures, jewelry, utensils, automotive nameplates, automotive trim, door hardware, sporting goods, medical instruments and devices, eyeglasses, cellular telephone housings, writing instruments, light/lamp fixtures, razors, and marine hardware, and fittings. FIG. 2 illustrates one embodiment of an article 10 that includes a substrate 12 having a rough surface 16, to which a polymeric layer 14 has been applied in order to level the surface. FIG. 3 illustrates another embodiment of an article 20, similar to article 10, and including a further metal layer 18 disposed over polymeric layer 14. FIG. 4 illustrates yet another embodiment of an article 30 which may be formed using the present processes. Article 30 includes a substrate 12 with a rough surface 16 as in the previous embodiments. A polymeric layer 14 is disposed on the surface 16 of the substrate 12 in order to level the surface 16. A metallic layer 18 followed by a polymeric layer 22 are disposed over the first polymeric layer 14.

WORKING EXAMPLES

Example 1

Application of leveling polymeric coating. A brass substrate was placed on an electrophoresis rack. Surface oxidation was removed from the substrate by immersing the rack in a caustic solution, available under the product name ELECTROCLEANER (trademark of MetalBond Technologies, LLC), which was followed by a tap water rinse. The caustic solution was neutralized by placing the rack in an acidic bath, followed by a deionized (DI) water rinse.

The rack was transferred to a polymeric bath maintained at a temperature of about 75° F. The polymeric bath contained an aqueous solution/suspension of about 10 to about 14% by volume of a polyurethane available under the product name TECHNICLAD V-BASE®. A DC voltage of about 100V was applied to the rack and maintained for about 90 seconds.

The rack was transferred to a rinse bath, and allowed to remain in the rinse bath for about 30 seconds. The rinse bath contained solvents, an emulsion stabilizer, and de-ionized (DI) water. The rack was transferred to a DI water rinse bath and allowed to remain in the DI water for about 30 seconds. The DI water rinse bath included a "wetter," which promoted sheeting of the water from the substrate to eliminate water spots.

The rack and substrate were then transferred into a convection oven. Once reaching a temperature about 400° F., the substrates were allowed to remain at temperature for about 45 minutes. At the end of the 45 minutes, the rack and substrate were removed from the oven to cool to ambient temperature.

Example 2

Application of PVD coating. A polyurethane coating was applied to a stainless steel substrate according to the process outlined in Example 1.

After cooling, the substrate was placed on a rack. The rack was placed in the process chamber of a Leybold 2-700 P4 Magnetron Sputtering System. The process chamber was pumped down to a pressure of about $9 \times 10^{-5}$ millitorr. Argon gas was introduced to the process chamber until it reached pressure of about $5 \times 10^{-3}$ millitorr. The substrate was sputter etched at about 300 W for about 300 seconds (dynamic mode) in order to remove any surface oxidation or contamination. A layer of chrome was deposited on the surface of the etched substrate by magnetron sputter deposition at 2000 W for about 10 minutes (dynamic mode) to reach a thickness of about 0.15 $\mu$m. The chamber pressure was brought to atmospheric pressure, and the substrate was removed from the system.

The adhesion of the PVD coating to the surface of the polymeric material was excellent (test BS 3900 E61974, rating 0).

The appearance of the metal coating was lustrous and highly reflective as measured in a standard L.A.B. test, using a Minolta CM-5031 spectrophotometer and a D-65 light source. The L.A.B. readings of the substrate surface were: L:75.5; A:1.1; B:4.4.

Example 3

Application of clear protective polymeric coating. A substrate was coated with a polyurethane layer and a PVD layer according to Examples 1 and 2 The PVD coated substrate was then placed on an electrophoresis rack Surface oxidation was removed from the substrate by immersing the rack in ELECTROCLEANER™, which was followed by a tap water rinse. The caustic solution was neutralized by placing the rack in an acidic bath, followed by a DI water rinse. The rack was transferred to into a polymeric bath maintained at a temperature of about 75° F. The polymeric bath contained an aqueous solution/suspension of about 10 percent to about 14 percent by volume of a polyurethane available under the product name TECHNICLAD HARP (available from MetalBond Technologies, LLC). A DC voltage of about 100V was applied to the rack and maintained for about 90 seconds. The rack was transferred to a rinse bath, and allowed to remain in the rinse bath for about 30 seconds. The rinse bath contained solvent, emulsion stabilizer, and DI water. The rack was transferred to a DI water rinse bath and allowed to remain in the DI water for about 30 seconds. The DI water rinse bath included a "wetter," which promoted sheeting of the water from the substrate to eliminate water spots. The rack and substrate were then transferred into a convection oven. Once reaching a temperature about 320° F., the substrates were allowed to remain at that temperature for about 12 minutes. At the end of the 12 minutes, the rack and substrate were removed from the oven to cool.

It will be understood that various modifications may be made to the embodiments disclosed herein. These and other changes can be made provided the functioning and operation thereof are not adversely affected. Therefore, the above description should not be construed as limiting, but merely as exemplifications of a preferred embodiment. Those skilled in the art will envision other modifications within the scope spirit of the invention.

What is claimed is:

1. A method of coating a substrate, comprising:
   providing a substrate having a surface;
   forming a polymeric layer on the surface of the substrate by electrophoretically applying a layer of a polymeric precursor to at least a portion of the surface;
   polymerizing the polymeric precursor to form a polymerized layer; and
   applying a metal coating to at least a portion of the polymerized layer;
   wherein the metal coating is applied under subatmospheric conditions, and wherein the step of forming the polymerized layer includes elevating the temperature of the polymeric precursor to a temperature of at least about 320° F.

2. The method of claim 1, wherein the polymeric precursor is selected from the group consisting of acrylics, epoxies, urethanes, and combinations thereof.

3. The method of claim 1, wherein the substrate is porous, and further comprising leveling the surface of the substrate before the step of applying the metal coating.

4. The method of claim 3, wherein the metal coating is applied using a physical vapor deposition method.

5. The method of claim 4, further comprising the step of removing a portion of the polymerized layer before applying the metallic coating.

6. The method of claim 5, further comprising cleaning at least the polymerized layer before the step of removing a portion of the polymerized layer.

7. The method of claim 4, wherein the metal coating is applied in a pressure range of about $5 \times 10^{-4}$ millitorr to about $2 \times 10^{-3}$ millitorr.

8. The method of claim 4, wherein the metal coating is applied by evaporation.

9. The method of claim 1, further comprising maintaining the polymeric precursor at the temperature for at least about 12 minutes.

10. A method of coating a surface comprising:

providing a substrate;

coating at least a portion of the substrate with a layer of an electrophoretically applied polymeric precursor;

polymerizing the polymeric precursor to form a first polymeric coating; and elevating the temperature of the polymeric coating to at least about 400° F. for at least about 6 minutes.

11. The method of claim 10, further comprising applying a layer of metal over at least a portion of the polymeric coating.

12. The method of claim 11, further comprising applying a second polymeric coating over the layer of metal.

13. A method of coating a substrate, comprising:

providing a substrate having a porous surface;

forming a polymeric layer on the surface of the substrate by electrophoretically applying a layer of a polymeric precursor to at least a portion of the surface;

polymerizing the polymeric precursor to farm a polymerized layer; and applying a metal coating to at least a portion of the polymerized layer;

wherein the metal coating is applied under subatmospheric conditions; and wherein the surface of the substrate is leveled before the step of applying the metal coating.

14. The method of claim 13, wherein the step of forming the polymerized layer includes elevating the temperature of the polymeric precursor to a temperature of at least about 320° F.

15. The method of claim 14, further comprising maintaining the polymeric precursor at the temperature for at least about 12 minutes.

16. The method of claim 13, wherein the polymeric precursor is selected from the group consisting of acrylics, epoxies, urethanes, and combinations thereof.

17. The method of claim 13, wherein the metal coating is applied using a physical vapor deposition method.

18. The method of claim 13, further comprising the step of removing a portion of the polymerized layer before applying the metal coating.

19. The method of claim 18, further comprising cleaning at least the polymerized layer before the step of removing a portion of the polymerized layer.

20. The method of claim 13, wherein the metal coating is applied in a pressure range of about $5 \times 10^{-4}$ millitorr to about $2 \times 10^{-5}$ millitorr.

21. The method of claim 13, wherein the metal coating is applied by evaporation.

* * * * *